(12) United States Patent
Willer

(10) Patent No.: US 7,375,387 B2
(45) Date of Patent: May 20, 2008

(54) METHOD FOR PRODUCING SEMICONDUCTOR MEMORY DEVICES AND INTEGRATED MEMORY DEVICE

(75) Inventor: Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 259 days.

(21) Appl. No.: 11/371,743

(22) Filed: Mar. 9, 2006

(65) Prior Publication Data

US 2006/0145227 A1 Jul. 6, 2006

Related U.S. Application Data

(62) Division of application No. 10/795,611, filed on Mar. 8, 2004, now Pat. No. 7,041,545.

(51) Int. Cl.
*H01L 29/94* (2006.01)

(52) U.S. Cl. .................. 257/213; 257/314; 257/315

(58) Field of Classification Search ........... 257/213, 257/314, 315
See application file for complete search history.

(56) References Cited

U.S. PATENT DOCUMENTS

| | | | |
|---|---|---|---|
| 5,768,192 A | 6/1998 | Eitan | |
| 6,011,725 A | 1/2000 | Eitan | |
| 6,548,861 B2 | 4/2003 | Palm et al. | |
| 6,570,211 B1 | 5/2003 | He et al. | |
| 6,580,120 B2 | 6/2003 | Haspeslagh | |
| 6,697,280 B2 | 2/2004 | Natori | |
| 6,743,674 B2 | 6/2004 | Wang | |
| 6,803,620 B2 | 10/2004 | Moriya et al. | |
| 6,806,517 B2 | 10/2004 | Kim et al. | |
| 2002/0079533 A1 | 6/2002 | Horiguchi et al. | |
| 2002/0132430 A1 | 9/2002 | Willer et al. | |
| 2002/0137296 A1 | 9/2002 | Satoh et al. | |
| 2003/0015752 A1 | 1/2003 | Palm et al. | |
| 2003/0160260 A1 | 8/2003 | Yoshino | |
| 2003/0185055 A1 | 10/2003 | Yeh et al. | |
| 2003/0230783 A1 | 12/2003 | Willer et al. | |
| 2004/0014280 A1 | 1/2004 | Willer et al. | |

OTHER PUBLICATIONS

Johnson, F.S., et al., "Selective Chemical Etching of Polycrystalline SiGe Alloys with Respect to Si and SIO$_2$," Journal of Electron Materials, 1992, Vol. 21, No. 8, pp. 805-810.
Yeh, C.C., et al., "PHINES: A Novel Low Power Program/Erase, Small Pitch, 2-Bit per Cell Flash Memory," IEEE, 2002, 4 pages.
Franke, A.E., et al., "Polycrystalline Silicon-Germanium Films for Integrated Microsystems," Journal of Microelectromechanical Systems, vol. 12, No. 2, Apr. 2003, pp. 160-171.
Lee, S.Y., et al., "A Novel Multibridge-Channel MOSFET (MBCFET): Fabrication Technologies and Characteristics," IEEE Transactions on Nanotechnology, vol. 2, No. 4, Dec. 2003, pp. 253-257.

*Primary Examiner*—Douglas M. Menz
(74) *Attorney, Agent, or Firm*—Slater & Matsil, L.L.P.

(57) ABSTRACT

The invention provides an integration scheme for a memory cell array, especially a charge-trapping memory cell array, comprising an architecture of local interconnects, which enables to avoid nitride insulations of wordline stacks and to produce CMOS devices of different structures and dimensions in standard technology along with the tinier memory cell transistors.

19 Claims, 4 Drawing Sheets

METHOD FOR PRODUCING SEMICONDUCTOR MEMORY DEVICES AND INTEGRATED MEMORY DEVICE

This application is a divisional of U.S. patent application Ser. No. 10/795,611, filed on Mar. 8, 2004, now U.S. Pat. No. 7,041,545, entitled "Method for Producing Semiconductor Memory Devices and Integrated Memory Device," which is incorporated herein by reference.

TECHNICAL FIELD

The invention generally relates to semiconductor devices and more particularly to the integration of a memory cell array with logic addressing circuitry.

BACKGROUND

Memory cells and their structural features are submitted to a steady process of diminution in order to reduce the area of the cell array and to achieve an ever-growing storage density. This development is to some degree adverse to the requirements of the complementary transistors forming the addressing logic circuits arranged in the periphery of the memory cell array and usually produced in standard CMOS technology, which renders devices of larger dimensions. It is a heretofore unresolved problem, how memory cells comprising transistor structures on a scale of typically 70 nm, especially charge-trapping memory cells, can be integrated with CMOS devices of much larger dimensions on the same semiconductor substrate by a process which does not deviate significantly from standard manufacturing processes.

Memory devices with charge-trapping layers, especially SONOS memory cells comprising oxide-nitride-oxide layer sequences as storage medium, are usually programmed by channel hot electron injection. U.S. Pat. Nos. 5,768,192 and 6,011,725 disclose charge-trapping memory cells of a special type of so-called NROM cells, which can be used to store bits of information both at the source and at the drain below the respective gate edges. The programmed cell is read in reverse mode to achieve a sufficient two-bit separation. Erasure is performed by hot hole injection.

U.S. Patent Publication 2003/0185055 A1 and a corresponding paper of C. C. Yeh et al. entitled "PHINES: A Novel Low Power Program/Erase, Small Pitch, 2-Bit per Cell Flash Memory," 2002 IEEE, disclose a non-volatile semiconductor memory cell with electron-trapping erase state, which is operated as flash memory and is able to store two bits. The erasure takes place by Fowler-Nordheim tunneling of electrons from either channel or gate electrode into the storage layer of a conventional charge-trapping layer sequence, for example an ONO layer sequence. In programming this memory, electric holes are injected into the non-conducting charge-trapping layer. Hot hole injection can be induced at source and drain, i.e., at both ends of the channel.

SUMMARY OF THE INVENTION

In one aspect, the present invention provides a method of producing a memory cell array structure that is appropriate for an integration of charge-trapping memory cells with CMOS electronic circuits.

In another aspect, the invention provides a method of producing an arrangement of memory cells, especially charge-trapping memory cells, that are designed for long data retention times and having small channel lengths. These cells can be produced within an extremely reduced area of a chip surface having a minimal vertical structure pitch together with the integration of CMOS transistors having comparatively large source/drain distances suitable for high electric voltages.

In a further aspect, the invention helps to remove the problem of the application of nitride material to insulate the wordline stacks. This feature reduces the endurance due to a larger retention loss.

In yet a further aspect, the invention provides an integration scheme for a charge-trapping memory cell array including an architecture of local interconnects electrically connecting source/drain regions of quadruples of four memory cells. The cells are arranged in every second gap between the wordlines along the direction of bitlines that are arranged in an upper layer level above the wordlines.

The preferred embodiment method includes forming a gate oxide on a surface of a semiconductor body, in a fashion adapted to the different transistor structures within the memory cell array area and within the addressing circuit peripheral area. A memory layer sequence of oxide, nitride and oxide or other suitable materials used as charge-trapping layers of the memory cells can also be applied and structured in this process step, but this is not the preferred embodiment. Shallow trench isolations can be formed at the same surface of the semiconductor body to produce electrically insulating strips within the semiconductor material that are spaced apart from one another and arranged parallel to one another in the memory cell region.

A gate electrode layer, preferably of polysilicon, a wordline layer, preferably a metal or metal-silicide layer, and a hardmask layer, preferably of silicon nitride, are formed on the surface of the semiconductor body. These layers are structured so as to form wordline stacks that are spaced apart and parallel to one another and that run across the shallow trench isolations. These stacks also delimit the location of the memory layer between the gate electrode layer and a channel region of the memory cells. This can be accomplished either by structuring the already provided memory layer sequence or by enabling the formation of a memory layer in undercut openings at lower edges of the gate electrode layer. The gate oxide between the wordline stacks is etched away, thereby preferably forming undercut openings between the gate electrode layer and the semiconductor material.

In a preferred embodiment, a memory layer sequence is arranged within the undercut openings on both sides of the wordline stacks, especially a charge-trapping memory layer of dielectric material, for instance silicon nitride, embedded in dielectric confinement material like silicon oxide. Doping atoms are implanted to form source/drain regions on both sides of the wordline stacks. A gap filling, preferably of oxide material, is deposited between the wordline stacks, and the oxide material is planarized to an upper surface level of the hardmask layer. A cap layer, preferably of nitride, is applied. Parts of the cap layer and of an upper partial layer of the gap filling within an area provided for contact holes are removed to form recesses. Spacers can be formed on sidewalls of the recesses.

The gap filling is further removed to form contact holes, in the course of which process step gap filling residuals are left on the sidewalls of the wordline stacks beneath the spacers. The contact holes are filled with an electrically conducting material, especially polysilicon, which is structured to form local interconnects that are provided for an electric connection of said source/drain regions to bitlines to be applied in superior layer levels.

An upper insulating layer, which is structured, together with the cap layer, the hardmask layer, the wordline layer, and the gate electrode layer in a peripheral area is applied to form residual stacks comprising gate electrodes or gate electrodes and conductor tracks intended for the CMOS transistor structures of the addressing circuitry. Sidewall spacers are applied to the residual stacks in the peripheral area. A dopant is implanted to form source/drain regions provided for CMOS devices, and the sidewall spacers are removed.

A dielectric material is applied to fill free spaces between the residual stacks and to form a basic dielectric provided for the application of a wiring, especially a multi-level metallization wiring comprising conductor tracks and intermetal dielectric. Contact holes are formed to contact the source/drain regions of the CMOS devices and, depending on the embodiment, to contact the gate electrode of these devices, and contact holes for electric contacts of the local interconnects, as well as bitline openings provided for the bitlines to be arranged in an upper layer level. A first metallization is applied to form contact vias in said contact holes and bitlines, which are preferably formed by a dual damascene process. Finally, an intermetal dielectric and further metallizations are applied to form the intended wiring.

The hardmask layer, the cap layer and the insulation layer are preferably applied as silicon nitride layers. The local interconnects are provided as electric connections between the source/drain regions and the bitlines. The local interconnects contact the source and drain regions of two pairs of memory cells that are subsequently arranged along the two adjacent wordlines. Thus, each local interconnect connects a bitline to the source/drain regions of quadruples of memory cells arranged within a square in such a manner that two of these memory cells are adjacent in the direction of the wordlines and the other two memory cells of this quadruple are adjacent to the first two memory cells, respectively, on the same side, in the direction of the bitline. Each of the memory cells within such a quadruple belongs to exactly one further quadruple of memory cells, the second source/drain region of one of the cells being connected by a further local interconnect to first source/drain regions of the other three memory cells of the respective further quadruple of memory cells.

BRIEF DESCRIPTION OF THE DRAWINGS

Embodiments and examples of the invention are further described in detail in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
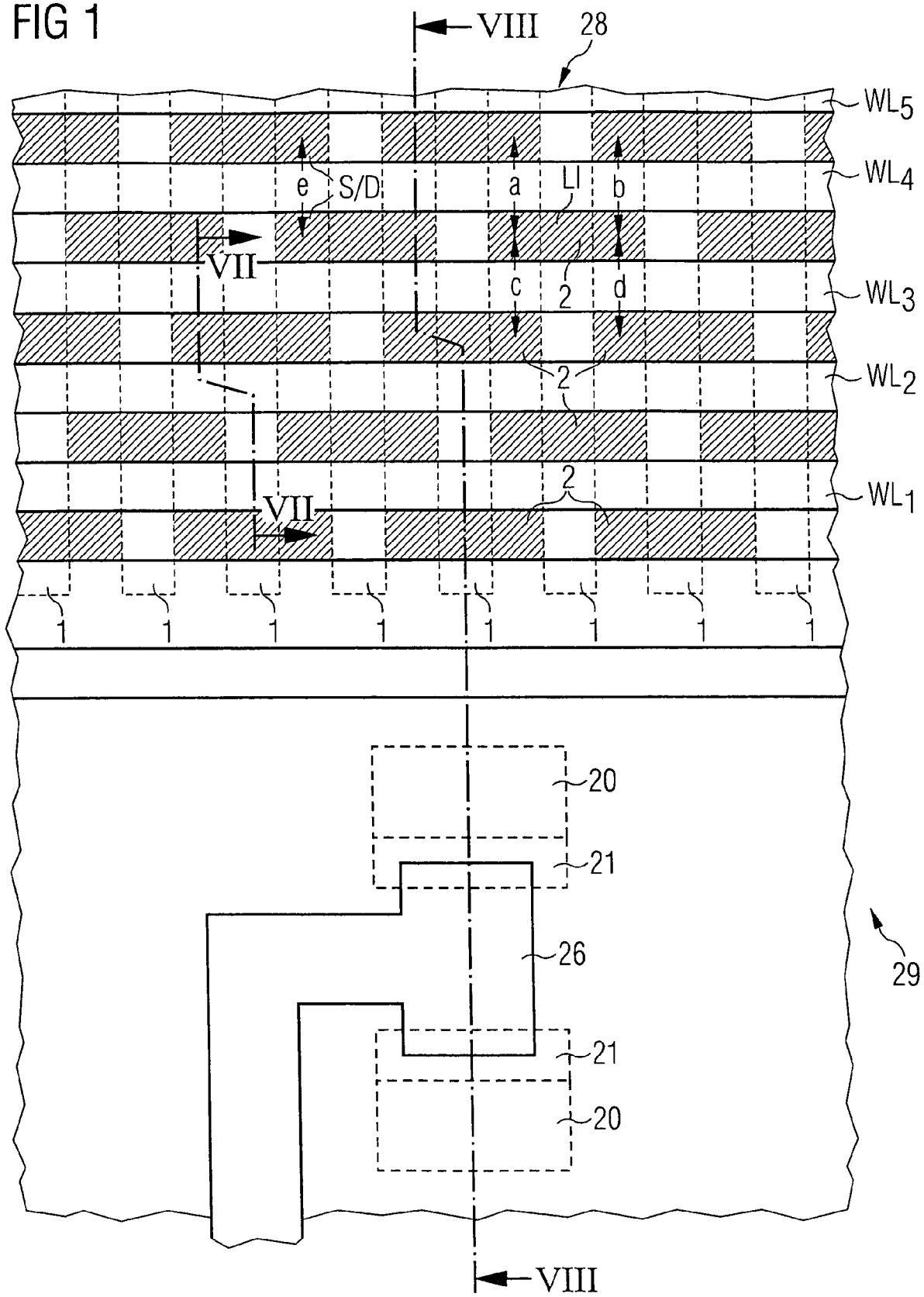
FIG. 1 shows a plan view of a memory cell array with periphery.

FIG. 1 shows the plan view onto a section of the surface of an intermediate product of a memory device fabricated according to a first embodiment. The wordlines $WL_n$ are represented running in parallel from left to right across the area of the memory cell array 28. This area comprises shallow trench isolations 1 within the semiconductor material of the substrate or semiconductor body, which are spaced apart and arranged parallel to one another, as indicated by broken lines, and run orthogonally across the wordlines. The bitlines are arranged above the areas of the shallow trench isolations 1 and are not shown here. Between the shallow trench isolations, there are the active areas comprising the memory cell transistor structures.

A preferred embodiment to be fabricated by the inventive method comprises electrically conductive local interconnects 2 arranged within the hatched areas of FIG. 1. Each of the local interconnects 2 bridges a shallow trench isolation 1 and connects source/drain regions of four adjacent memory cells that are arranged in a square. The channel region of the transistor structure of a memory cell is located under the appertaining wordline between the source/drain regions situated under the end parts of the local interconnects. The positions of the source/drain regions of a memory cell are shown in the example of memory cell e of FIG. 1, where the source/drain regions are designated by S/D.

If the memory cells are enumerated along the wordlines by a continuous enumeration, the local interconnects connect the source/drain regions of the odd-numbered memory cells on one side of the respective wordline to the source/drain regions of the subsequent even-numbered memory cell. On the other side of the same wordline, the local interconnects connect the source/drain regions of the even-numbered memory cells to the subsequent odd-numbered memory cell, according to this continuous enumeration. As the local interconnects 2 pertain to memory cells in both adjacent wordlines, the local interconnects 2 connect source/drain regions of a total of four memory cells, which are arranged in a square quadruple. The memory cells located at a, b, c, and d in FIG. 1, for example, are connected by the local interconnect LI designated in FIG. 1 so that each of these four memory cells comprises a source/drain region that is connected to a source/drain region of the other three memory cells of this quadruple.

The memory device further includes an addressing periphery, where CMOS devices are arranged to form electric circuitry provided as logic circuit to address the memory cells in read, write and erase operations. The complementary transistors of these electronic circuits are produced according to standard technology, but the producing steps are incorporated in the inventive method, which allows the fabrication of a charge-trapping memory cell array of extremely small dimensions with integrated CMOS addressing circuitry. FIG. 1 shows, by way of example, a transistor structure comprising a gate electrode 26 provided to control the channel region between source/drain regions 20 that include LDD (lightly doped drain) regions 21. The area of the memory cell array 28 is typically separated from the peripheral area 29 comprising the CMOS devices, which are processed according to the standard technology comprising the arrangement of p-wells and n-wells within the semiconductor substrate provided for complementary transistors.

Figure 2:
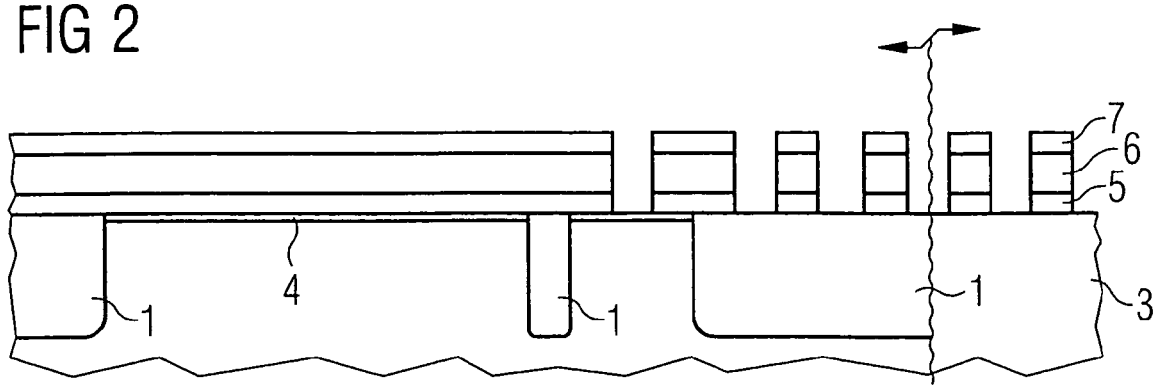
FIG. 2 shows a cross-section of a first intermediate product of a preferred example of the inventive method.
Figure 8:
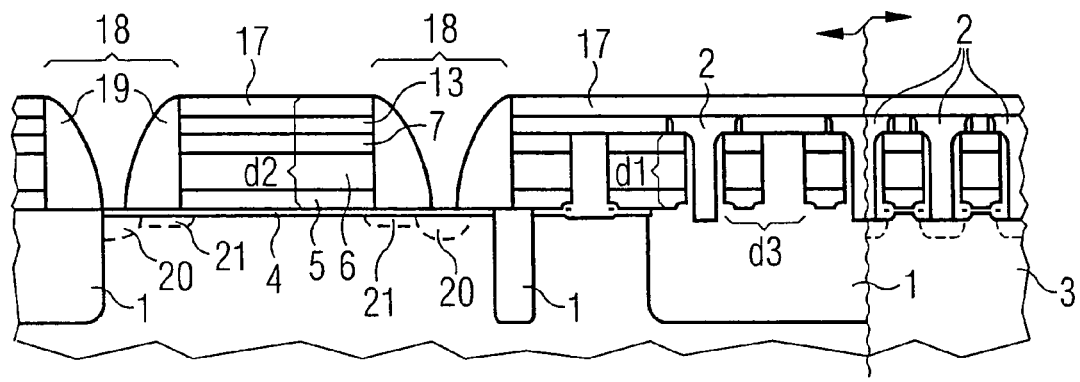
FIG. 8 shows the cross-section according to FIG. 6 for a fifth intermediate product after further process steps.

FIG. 2 shows the cross-section of an intermediate product along the broken line inserted in FIG. 1 bearing reference to FIG. 8. On the right hand side, this cross-section shows the area of a memory cell array in two different planes of reference. To the left of the waved line, the cross-section through the area of the shallow trench isolation 1 is shown, while on the right side of the waved line, the section across the active area is shown. The shallow trench isolations 1 are produced in standard fashion by etching trenches into the semiconductor material and filling these trenches afterwards with dielectric material, preferably oxide. A gate oxide 4 is applied to an upper surface of a semiconductor body 3. The gate oxide 4 can be adapted in thickness and material to the different transistor types to be manufactured. Wells (not shown) can be implanted and annealed according to the different types of transistors in different regions of the semiconductor body.

Then a layer sequence provided for the wordline stacks is applied on the upper surface of the semiconductor body. This layer sequence preferably comprises a gate electrode layer 5, preferably of polysilicon, a wordline layer 6 that is intended to reduce the electric track resistance of the wordline and is preferably made of metal or metal silicide, and a hardmask layer 7, which is preferably nitride. By a subsequent photolithography and etching step, this gate electrode layer 5, this wordline layer 6 and this hardmask layer 7 are structured to form parallel wordline stacks in the area provided for the memory cell array 28. In order to be comprehensive, FIG. 2 shows an intermediate stack, the lateral dimension of which differs from the fixed pitch of the breadth of the wordlines and the interspaces between the wordlines and which is located in a transitional area between the area of the memory cell array 28 and the CMOS peripheral area 29 as a result of boundary effects occuring in the lithography step.

Figure 3:
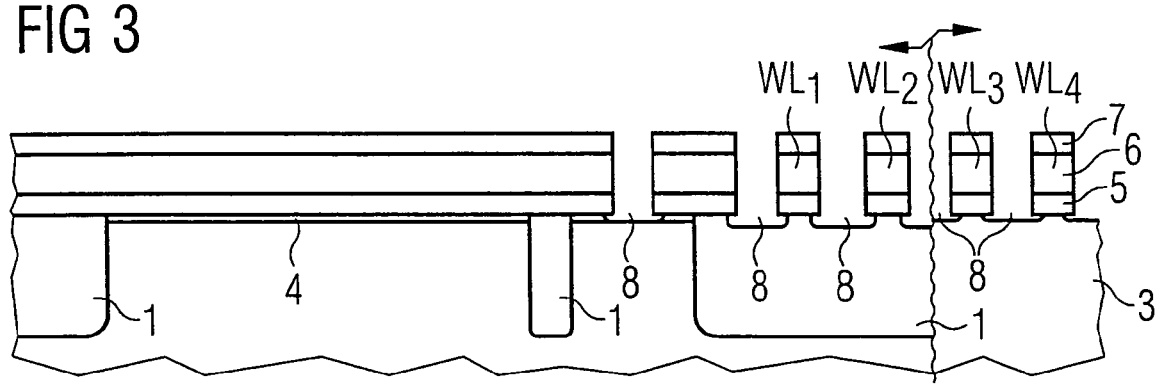
FIG. 3 shows the cross-section according to FIG. 2 of a second intermediate product after further process steps.

FIG. 3 shows the cross-section according to FIG. 2 after a wet etching process step to form the etched openings 8 in the gate oxide 4 and the shallow trench isolations 1 within the area of the memory cell array 28. As can be seen from FIG. 3, the oxide material of the shallow trench isolations 1 is etched typically about 20 to 30 nm deep, e.g., somewhat deeper than the gate oxide 4. The etched openings 8 also form undercut openings between the gate electrode layer 5 and the semiconductor body 3 at lower lateral edges of the gate electrode layer 5, as shown on the right side of the wavy line. FIG. 3 also shows the wordline stacks of wordlines $WL_1$, $WL_2$, $WL_3$, and $WL_4$ to be compared with the plan view of FIG. 1.

Figure 4:
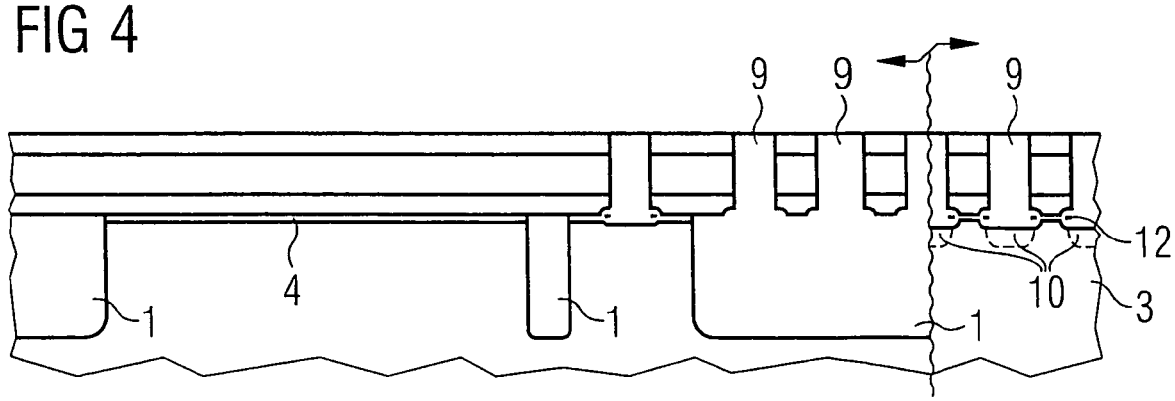
FIG. 4 shows the cross-section according to FIG. 3 for a third intermediate product after further process steps.

FIG. 4 shows the cross-section according to FIG. 3 after further process steps, by which the memory layer sequence, especially a charge-trapping layer sequence, is fabricated. The preferred example of the inventive method is further described for the preferred embodiment comprising an ONO memory layer sequence, although any material sequence which is appropriate for charge-trapping memory cells can be applied as well.

Memory layer 12 is formed by formation of multiple layers. A lower confinement layer is prepared, which is an oxide layer in the case of an oxide-nitride-oxide charge-trapping layer sequence. The lower confinement layer can be produced by a combination of a thermal oxidation of the semiconductor material and the deposition of a high-temperature oxide to a thickness of typically about 4 nm. The deposition of an LPCVD (low pressure chemical vapor deposition) nitride layer of a thickness of about 4 nm follows, by which the memory layer 12, the actual site of the charge storage, is produced in the undercut openings between the gate electrode layer and the semiconductor material. Then the source/drain regions 10 are formed by an implantation of doping atoms, for example boron or arsenic. After an anneal of the source/drain implant, the deposited nitride is wet etched so that the memory layer remains in the provided dimensions.

The described process steps which make use of the undercut openings create a memory layer comprising striplike parts that are only a few nanometers wide and especially adapted to multi-bit memory cells of small dimensions and extremely short channels because they provide a sufficient electric separation between the sites of the stored bits. Nonetheless, as mentioned above, it is also possible to have a charge-trapping layer which is formed in a standard fashion and is not interrupted above the middle section of the channel.

FIG. 4 shows the location of the source/drain regions 10 and the memory layer 12. In each wordline stack $WL_n$ of this embodiment, the memory layer 12 is composed of two strips running along the lower edges of the gate electrode layer 5. The surface of the structure is re-oxidized to form thin oxide layers (not explicitly shown) on the sidewalls of the wordline stacks. The gaps between the wordline stacks are filled by deposition of a gap filling 9, preferably an oxide, which is subsequently planarized, for example by CMP (chemical mechanical polishing). Upon the planar surface formed by the hardmask layer 7 and the planar gap fillings 9, a cap layer 13 is deposited, as will be described with respect to FIG. 6.

Figure 5:
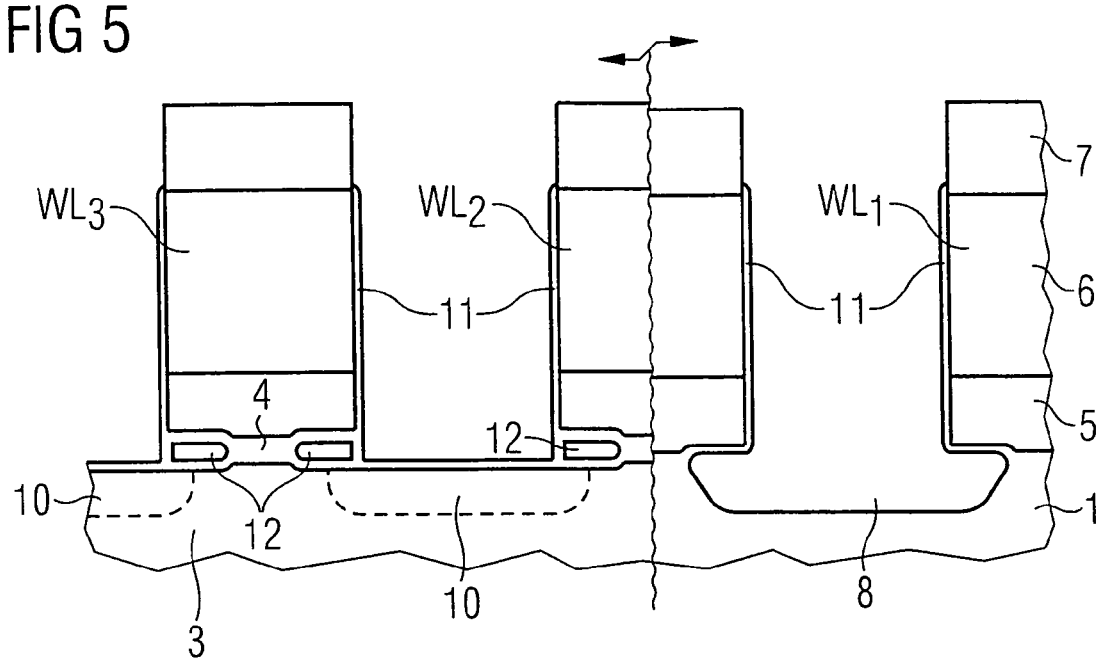
FIG. 5 shows an enlarged cross-section of the third intermediate product according to FIG. 4.
Figure 7:
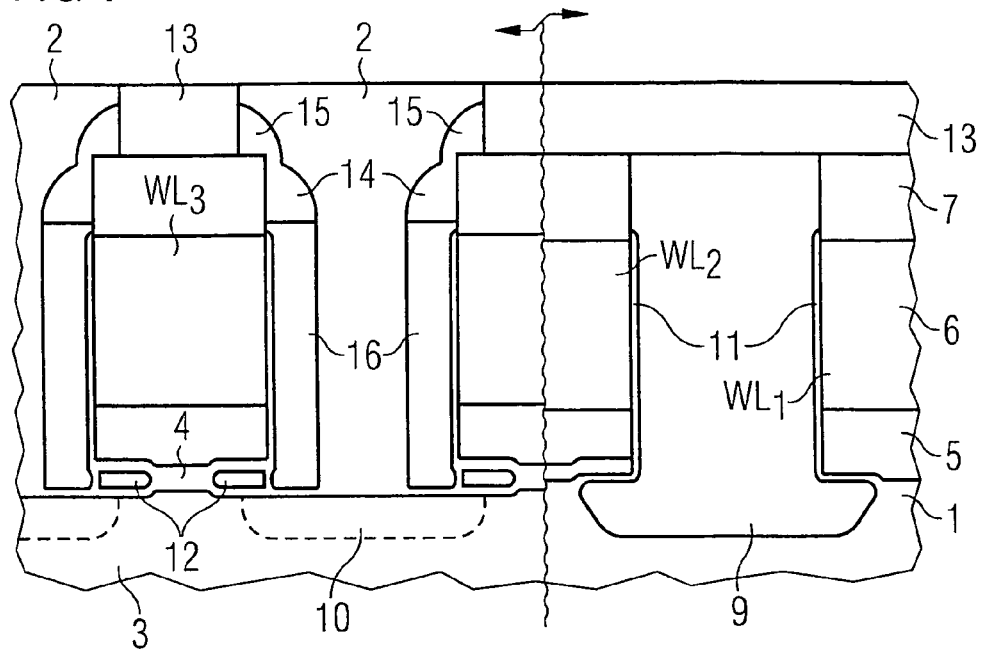
FIG. 7 shows an enlarged cross-section of the fourth intermediate product according to FIG. 6.

FIG. 5 shows an enlarged cross-section of the intermediate product according to FIG. 4 along the broken line inserted in FIG. 1, bearing reference to FIG. 7, encompassing the area of the sequence of the wordline stacks of the first three wordlines $WL_1$, $WL_2$, and $WL_3$. (Note that in FIG. 5, the shallow trench isolation region 1 is now on the right hand side of the figure.) The boundaries of the implanted source/drain regions 10 are shown by broken lines designating the PN-junctions. The cross-sections of the striplike parts of the memory layer 12 are shown between the lower edges of the gate electrode layer 5 and the semiconductor body 3. The memory layer 12, which is, for instance, nitride, is embedded in dielectric material that is oxide material in the case of an ONO memory layer sequence and can be part of the gate oxide 4. The sidewalls of the wordline stacks are covered by re-oxidation layers 11. The region between the active regions is shown on the right side of FIG. 5, where the etched openings 8 appear in the area of the shallow trench isolation 1. The gaps between the wordlines are filled with gap filling of a dielectric material, preferably silicon oxide, as described above.

Figure 6:
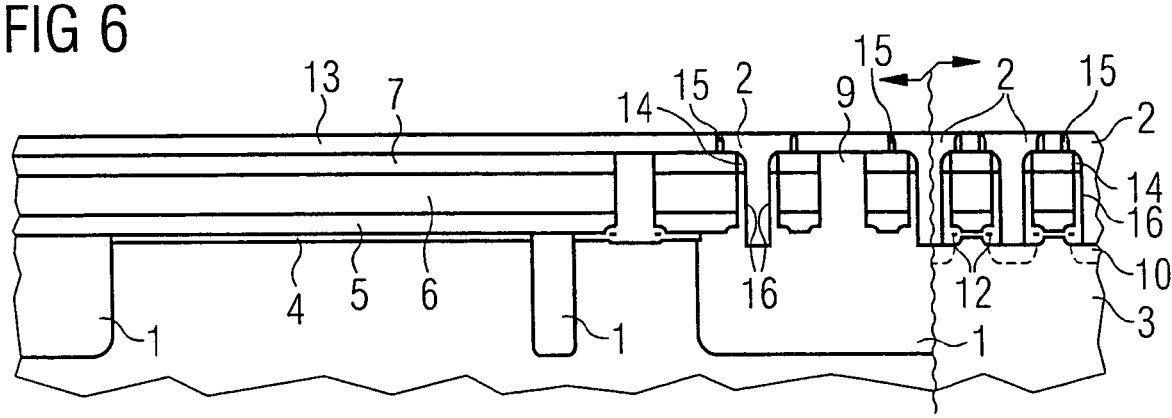
FIG. 6 shows the cross-section according to FIG. 4 for a fourth intermediate product after further process steps.

FIG. 6 shows a cross-section according to FIG. 4 after the formation of source/drain contacts 2, which are part of local interconnect 2. FIG. 7 shows an enlarged view of a portion of FIG. 6. After the planarization step, the cap layer 13, preferably of nitride (e.g., silicon nitride), is deposited and structured by a subsequent photolithography step. In this step, the cap layer 13 is removed in the areas provided for the source/drain contacts 2. If the cap layer 13 is nitride and the gap filling 9 is oxide, the cap layer 13 is preferably structured by reactive ion etching. The etching process is stopped when the oxide of the gap filling 9 is reached. After this, recesses are etched into the material of the gap filling 9. The depth of these recesses may at least approximately correspond to the thickness of the hardmask layer 7. Then, the material which is provided for the formation of sidewall spacers is deposited. This material can preferably be nitride, which is removed by reactive ion etching to form typically 30 nm wide first spacers 14 in the recesses at the level of the hardmask layer 7 and second spacers 15 on sidewalls of the openings in the cap layer 13.

The first spacers 14 are relevant for a subsequent anisotropic etching process, by which the gap filling 9 is removed down to the surface of semiconductor material in the area of the source/drain regions 10. As the etching process is anisotropic, the first spacers 14 mask the material of the gap fillings 9 on the sidewalls of the wordline stacks so that gap filling residues 16 are left on these sidewalls, forming sidewall insulations of the wordlines. This stage of the preferred inventive method provides sidewall insulations of the wordlines that can be formed of oxide instead of the usually applied nitride, as shown by the described example.

Then an electrically conductive material such as polysilicon can be applied to form the local interconnects 2, which are provided as source/drain contacts and electric connections between the source/drain regions and the bitlines.

There are different possibilities to structure the local interconnects 2 according to the required dimensions along the wordlines. The etching of the gap filling 9 can be performed using a mask which covers periodically spaced regions of the gaps between the wordline stacks so that the material of the gap filling 9 remains in these regions as electric insulation between the etched holes, which are filled with the electrically conductive material provided for the local interconnects 2. However, a preferable process step sequence to structure the local interconnects 2 comprises the etching of the gap filling 9 to form continuous trenches between the gap filling residues 16 in the opened gaps between the wordline stacks, which are filled with the electrically conductive material provided for the local interconnects 2. This material is then structured according to the required longitudinal dimensions of the local interconnects 2 by means of a mask and a further etching process; and the interspaces between the structured interconnects are filled again with dielectric material, preferably with oxide. The material of the local interconnects 2 is planarized.

FIG. 7 shows an enlarged cross-section according to FIG. 5 of the intermediate product according to FIG. 6. In this cross-section, the gap filling 9, the re-oxidation layer 11, the arrangement of the memory layer 12, the structured cap layer 13, the first spacers 14, the second spacers 15, and the gap filling residues 16 are represented in detail. The first spacers 14, which have served to structure the gap filling 9 into the gap filling residues 16, are not necessarily separated from the second spacers 15, as shown in FIG. 6, but may be only slightly detached from them. This feature may vary according to the embodiment. It is merely important to have first spacers 14 to mask the marginal parts of the gap filling 9 so that they are not etched away, but form the sidewall insulation of the wordline stacks.

FIG. 8 shows the cross-section according to FIG. 6 after further process steps performed to structure the CMOS devices. After the application of an upper insulating layer 17, which may be deposited as plasma enhanced nitride, covered with an anti-reflective coating to aid the subsequent photolithography, the CMOS devices are structured by etching interstices 18 in the peripheral area. This structuring defines the gate electrodes that form part of the gate electrode layer 5. This is shown on the left side of FIG. 8. After a standard re-oxidation step, doping atoms are implanted to form LDD (lightly doped drain) regions 21. After the deposition of a nitride liner, wide sidewall spacers, especially oxide spacers 19, are formed at the sidewalls of the gate electrode stacks. These sidewall spacers 19 have a typical width of about 150 nm. The sidewall spacers 19 are then used as masks for source/drain implantations to form source/drain regions 20 of the CMOS devices. The LDD regions 21 are covered by the sidewall spacers 19 during this implantation.

The interstices 18 between the CMOS devices are considerably larger than the small gaps between the wordline stacks. By the preferred inventive method, it is possible to produce both the transistor structures in the memory cell array having typical dimensions of down to 70 nm and the CMOS device structures having typical lateral dimensions that necessitate the application of wider sidewall spacers 19. As the height, i.e., the vertical dimension with respect to the substrate 3, of the gate stacks in the peripheral area 29 is larger than the height of the wordline stacks, the interstices 18 have to be comparatively broader than the gaps between the wordline stacks in the memory cell area 28.

In the preferred embodiments of the inventive structure, the vertical dimension d1 of the wordline stack comprising the gate electrode layer 5, the wordline layer 6 and the hardmask layer 7 is at most 200 nm, while the vertical dimension d2 of the gate stacks comprising the aforementioned layers plus the cap layer 13 and the insulating layer 17 is at least 250 nm. The lateral pitch d3 of the memory cell array, measured across the wordline stacks as a distance between corresponding spots of adjacent wordline stacks, can be chosen to be at most 250 nn. Therefore, the preferred inventive method provides a sequence of processing steps that is suitable to manufacture the CMOS devices of the circuitry in the peripheral area with the appropriate dimensions after the memory cell array has completely been structured in essentially smaller dimensions. In this manner, the appropriate lateral and vertical dimensions can be chosen according to the types of transistor devices. The described layer sequence and sequence of process steps is especially adapted to the production of completely integrated memory devices.

Figure 9:
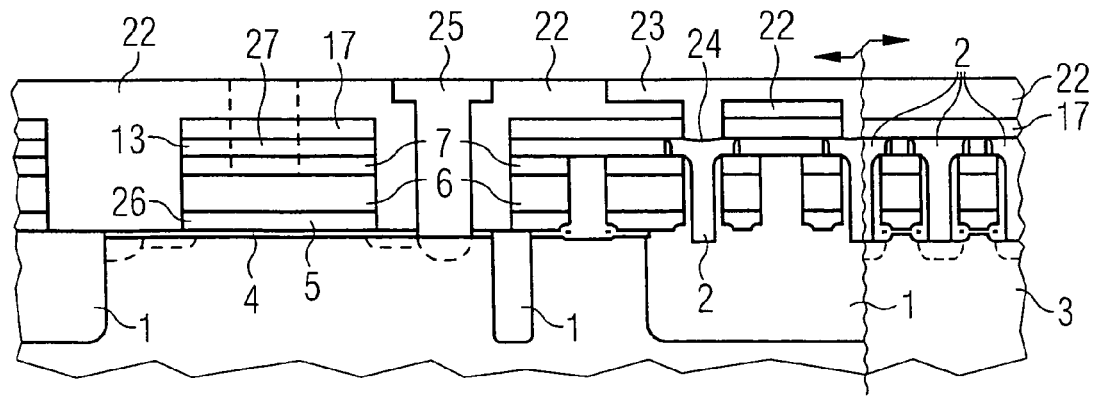
FIG. 9 shows the cross-section according to FIG. 8 for a sixth intermediate product after further process steps.

FIG. 9 shows the cross-section of FIG. 8 after the application of source/drain contacts in the peripheral area 29. After an anneal of the junction implants, the sidewall spacers 19 have been removed, for instance by wet etching. The interstices 18 are then filled with dielectric material, which may comprise deposited oxide and nitride layers according to standard technology and a main gap filling of BPSG (boron phosphorous silicate glass). Especially in the area of the memory cell array 28, this filling forms a basic dielectric 22 for the metallization levels of a wiring.

FIG. 9 shows a bitline 23 with bitline contact 24 on the local interconnect 2 adjacent to the first wordline $WL_1$. The bitline 23 and the bitline contact 24 can be produced by the process known by the name of dual damascene. Contact holes, subsequently filled with electrically conductive material, serve to produce drain contact vias 25 on the source/drain regions of the CMOS devices to be connected. The gate electrode 26 of the CMOS device can also be contacted by means of a gate contact via 27. As the gate electrode 26 can also be electrically connected by an appropriately structured part of the gate electrode layer 5, for example as shown in FIG. 1, the gate contact via 27 is indicated with a broken line in FIG. 9. Further metal wiring layers and intermetal oxides are applied in the usual fashion and are not shown in FIG. 9. This memory device is then further processed in standard finishing process steps including passivation and housing. This is not described in detail as it is not constituent of the inventive method.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated memory device, comprising:
a semiconductor body having a main surface;
a memory cell array arranged at the main surface of the semiconductor body, the memory cell array comprising wordline stacks having a first dimension in a direction perpendicular to the main surface of the semiconductor body;
a peripheral area at the main surface of the semiconductor body provided for integrated CMOS circuitry to address the memory cell array in write, read, or erase operations; and
CMOS devices forming CMOS circuitry arranged in the peripheral area, the CMOS devices comprising gate stacks having a second dimension in the direction perpendicular to the main surface of the semiconductor body, wherein the first dimension is smaller than the second dimension, and wherein a difference between the first dimension and the second dimension is compensated by at least one further layer of dielectric material covering the wordline stacks.

2. The integrated memory device of claim 1, wherein:
the first dimension of the wordline stacks is at most 200 nm; and
the second dimension of the gate stacks is at least 250 nm.

3. The integrated memory device of claim 1, a pitch of the wordline stacks, measured across the wordline stacks as a distance between corresponding spots of adjacent wordline stacks, is at most 250 nm.

4. The integrated memory device of claim 1, further comprising at least one layer of dielectric material covering the wordline stacks, the at least one layer of dielectric material having a thickness equal to the difference between the first dimension of the wordline stacks and the second dimension of the gate stacks.

5. The integrated memory device of claim 1, wherein each wordline stack comprises:
a gate dielectric over a surface of the semiconductor body; and
a conducting layer over the gate dielectric.

6. The integrated memory device of claim 5, wherein each wordline stack further comprises a hardmask layer over the conducting layer.

7. The integrated memory device of claim 6, further comprising shallow trench isolations at the main surface of the semiconductor body, the shallow trench isolations providing electrically insulating strips spaced apart and arranged parallel to one another in a region provided for the memory cell array.

8. The integrated memory device of claim 7, wherein the wordline stacks are spaced apart and arranged parallel to one another and run across the shallow trench isolations in the region provided for the memory cell array, thereby delimiting a location of a memory layer between the gate electrode layer and a channel region of the memory cells.

9. The integrated memory device of claim 5, wherein the gate dielectric comprises a gate oxide.

10. The integrated memory device of claim 5, wherein the conducting layer comprises a wordline layer overlying a gate electrode layer.

11. The integrated memory device of claim 1, wherein the first dimension of the wordline stacks is at most 200 nm.

12. The integrated memory device of claim 1, wherein the second dimension of the gate stacks is at least 250 nm.

13. The integrated memory device of claim 1, wherein the memory cell array comprises a plurality of charge trapping memory cells.

14. The integrated memory device of claim 13, wherein each charge trapping memory cell includes a memory layer, the memory layer comprising a oxide-nitride-oxide layer sequence.

15. The integrated memory device of claim 14, wherein, for each memory cell, the memory layer is located in an undercut opening between a gate electrode and the semiconductor body.

16. A semiconductor memory device comprising:
a plurality of wordline stacks over a main surface of a semiconductor body, each wordline stack including at least one conductive material and a hardmask overlying the conductive material, the wordline stacks having a first dimension in a direction perpendicular to the main surface;
source/drain regions in the semiconductor body between the wordline stacks;
a gap filling between the wordline stacks extending to an upper surface level of the hardmask;
contact holes disposed in recesses within the gap filling, the contact holes being filled with electrically conductive material that is electrically isolated from the conductive material of the wordline stacks; and
CMOS circuitry disposed in peripheral area of the semiconductor body, the CMOS circuitry including CMOS devices that include gate stacks having a second dimension in the direction perpendicular to the main surface, wherein the first dimension is smaller than the second dimension, and wherein a difference between the first dimension and the second dimension is compensated by at least one further layer of dielectric material covering the wordline stacks.

17. The integrated memory device of claim 16, wherein:
the first dimension of the wordline stacks is at most 200 nm; and
the second dimension of the gate stacks is at least 250 nm.

18. The integrated memory device of claim 16, wherein a pitch of the wordline stacks, measured across the wordline stacks at a distance between corresponding spots of adjacent wordline stacks, is at most 250 nm.

19. The integrated memory device of claim 16, wherein the wordline stacks are each coupled to a plurality of charge trapping memory cells and wherein the CMOS circuitry comprises circuitry to address the memory cells in write, read or erase operations.

* * * * *